US005602934A

United States Patent [19]
Li et al.

[11] Patent Number: 5,602,934
[45] Date of Patent: Feb. 11, 1997

[54] ADAPTIVE DIGITAL IMAGE SIGNAL FILTERING

[75] Inventors: Jianhua Li, San Francisco; Haiguang Chen, Pacifica, both of Calif.

[73] Assignee: The Regents of the University of California, Oakland, Calif.

[21] Appl. No.: 118,921

[22] Filed: Sep. 8, 1993

[51] Int. Cl.$^6$ ................................................... G06K 9/00
[52] U.S. Cl. ........................................... 382/128; 382/260
[58] Field of Search .................................. 382/6, 54, 128, 382/131, 132, 254, 263, 264, 260; 364/413.23; 378/99, 901, 156

[56] References Cited

U.S. PATENT DOCUMENTS

| | | | |
|---|---|---|---|
| 4,792,900 | 12/1988 | Sones et al. | 382/6 |
| 4,945,478 | 7/1990 | Merickel et al. | 382/6 |
| 4,984,286 | 1/1991 | Dolazza | 382/6 |
| 5,148,499 | 9/1992 | Matsumura | 382/6 |

OTHER PUBLICATIONS

"Measurement–Dependent Filtering: A Novel Approach to Improved SNR"; Macovski et al; IEEE Transactions on Medical Imaging, vol. MI–2, No. 3, Sep. 1983.

"9.2.7 Edge–Sensitive Adaptive Image Restoration", *Two–Dimensional Signal and Image Processing*, J. S. Lim. Prentice Hall, Englewood Cliffs, NJ (1990).

"On the Gradient Inverse Weighted Filter", Xing Wang, IEEE Transaction on Signal Processing, vol. 40, No. 2, Feb. 1992.

Kaufman, *Proceedings of Technology Requirements for Biomedical Imaging*, IEEE Computer Society Press, May 1991.

Jain, *Fundamentals of Digital Image Processing*, Prentice Hall, Englewood Cliffs, NJ 07632, 1989, pp. 244–247, pp. 320–324.

Lee, *IEEE Trans. Patt. Anal. Machine Intell.*, vol. PAMI–2, pp. 165–168, Mar. 1980.

Woods et al, *IEEE Trans. pattern Anal. Machine Intell.*, vol. PAMI–9, pp. 245–253, Mar. 1987.

Jackson, *digital Filters and Signal Processing*, Kluwer Academic Publishers, 1989, pp. 86–87.

Kaufman et al, "Measuring Signal–to–Noise Ratios in MR Imaging", *Radiology* 1989, 173:265–267.

Goddard et al, "Multicomputer Implementations . . . ", Proceedings of SMRM 11th Annual Meeting, Berlin, Aug. 1992.

*Primary Examiner*—Yon J. Couso
*Attorney, Agent, or Firm*—Nixon & Vanderhye P.C.

[57] ABSTRACT

A plurality of digitized subimage signal sets is generated by low-pass filtering an input digital image signal set along a respectively corresponding plurality of directions within the image. Thereafter, a set of noise-smoothed digital image signals is generated as a weighted combination of this first plurality of subimage signal sets. Preferably, the weight accorded to each subimage contribution is a function of the difference between the subimage and the original image, thus making the resultant filter adaptive to tissue structure.

37 Claims, 12 Drawing Sheets

ADAPTIVE DIGITAL IMAGE SIGNAL FILTERING

BACKGROUND OF THE INVENTION

1. Field of the Invention

This invention is generally related to adaptive filtering of digital image signals representing the arrayed pixels of a digitized image. The invention has particular, but not exclusive, application for noise-smoothing and structure-sharpening in medical image signal arrays of the type generated and displayed by magnetic resonance imaging (MRI) systems.

2. Related Art

Digital image signals (representing the arrayed pixels of a digitized image displayable on a CRT or other form of image signal transducer) are now commonly available from many sources. In the medical imaging field, such images are typically produced by CT scanners and MRI systems. Even traditional medical X-rays initially made on photographic film can be scanned and convened to a digitized image signal format. Digital image signals typically comprise an orderly array of multiple bit digital data values where each value (e.g., "words" or "bytes") represents the intensity (and/or color) of a particular predetermined pixel in a visual image to be displayed (e.g., by raster scanning and transducing the signals into visual images).

Unfortunately, such digital image signals typically include noise components which detract from image quality in both analytic and aesthetic senses. Especially in the case of medical images, such noise artifacts are troublesome since they may lead to inaccurate medical diagnoses or to an inability to make any diagnosis based on the viewable image. Accordingly, considerable efforts have been expended to filter noise components out of digital image signals such that the resulting filtered image, when displayed, will represent a more analytically correct and aesthetically pleasing representation of the patient tissue depicted in the display.

Although many quite sophisticated image filters have been proposed and/or employed, many of them have limited applicability and/or are otherwise often rather impractical to employ in a typical clinical environment where time and equipment resources are necessarily limited (e.g., as compared to a research laboratory environment, where virtually unlimited time and equipment resources may be available for repeated attempts at image enhancement filtering). Accordingly, there remains a considerable need for adaptive digital image signal filtering techniques that are both highly efficacious and economical (in terms of both required filter processing time and required filtering equipment resources).

In the field of MRI, a two-dimensional digitized image is typically obtained from a magnetic resonance imaging system representing for medical diagnosis a cross-sectional image of NMR nuclei defining tissue structures within a three-dimensional object. Unfortunately, most MR images are degraded by various distortions. Sometimes, these distortions result in inadequate object tissue representation and make accurate image analysis difficult. Among these distortions, noise contamination is often the most serious one. Effective corrections of other distortions are often closely related to and based on successful noise reduction. Therefore, noise reduction is a central issue in MR image processing for better image quality.

Some general background concerning problems and requirements in MR image processing may be found in the following references, the content of which is hereby incorporated by reference):

F. W. Wehrli, *Biomedical Magnetic Resonance Imaging—Principles, Methodology, and Applications*, Edited by F. W. Wehrli, D. Shaw and J. B. Kneeland, VCH Publishers, Inc., 1988;

L. Kaufman, L. E. Crooks and J. Carlson, "Technology Requirements for Magnetic Resonance Imaging System, in *Proceedings of Technology Requirements for Biomedical Imaging*, IEEE Computer Society Press, May 1991;

A. K. Jain, *Fundamentals of Digital Image Processing*, Prentice Hall, Englewood Cliffs, N.J. 07632, 1989;

W. K. Pratt, *Digital Image Processing*, John Wiley & Sons, Inc., 1978; R. C. Gonzalez and P. Wintz, *Digital Image Processing*, Addison-Wesley Publishing Company, 1988;

J. S. Lee, "Digital Image Enhancement and Noise Filtering by Use of Local Statistics," IEEE Trans. Patt. Anal. Machine Intell., Vol. PAMI-2, No. 2, pp. 165–68, March 1980;

J. W. Woods, S. Dravida and R. Mediavilla, "Image Estimation Using Doubly Stochastic Gaussian Random Field Models," IEEE Trans. Pattern. Anal. Machine Intell. Vol. PAMI-9, pp. 245–53, March 1987;

L. L. Scharf, *Statistical Signal Processing: Detection, Estimation, and Time Series Analysis*, Addison-Wesley Publishing Company, 1990;

L. B. Jackson, *Digital Filters and Signal Processing*, Kluwer Academic Publishing, 1989.

Noise filtering of images is essentially a smoothing process, but simple low-pass filtering will typically blur image edges and other tissue structures and thus damage structural tissue image fidelity. These tissue structures are significant to human viewers. They are also very important for automatic image analysis and synthesis, such as computer vision and image registration. Some filters have been proposed to address this problem successfully such as adaptive filtering based on local image statistics (e.g., see J. S. Lee, "Digital Image Enhancement and Noise Filtering by Use of Local Statistics," IEEE Trans. Patt. Anal. Machine Intell., Vol. PAMI-2, No. 2, pp. 165–68, March 1980) and Kalman filtering techniques using multiple image models (e.g., see J. W. Woods, S. Dravida and R. Mediavilla, "Image Estimation Using Doubly Stochastic Gaussian Random Field Models," IEEE Trans. Pattern. Anal. Machine Intell. Vol. PAMI-9, pp. 245–53, March 1987). Since, for medical diagnosis imaging, a study of MR often requires a sequence of plural images and since each digital image contains a large number of arrayed pixels, the processing efficiency of filtering is a fundamental consideration in choosing filters for fast medical image procedssing. Thus, although many filters may eventually provide acceptable filtering performance, slow processing speed often limits their wide application in medical imaging.

SUMMARY OF THE INVENTION

The present invention provides an especially effective and efficient filter for MR image processing. A plurality of digitized sub-image signal sets is generated by low-pass filtering an input digital image signal set along a respectively corresponding plurality of directions within the image.

Thereafter, a set of noise-smoothed digital image signals is generated as a weighted combination of this first plurality of subimage signal sets. Preferably, the weight accorded to each subimage contribution is a function of the difference between the subimage and the original image, thus making the resultant filter adaptative to tissue structure.

In the preferred exemplary embodiment, the edges of tissue structures within the noise-smoothed digital image are sharpened by thereafter generating from the noise-smoothed digital image signal set a plurality of further digitized sub-image signal sets by high-pass filtering along a respectively corresponding plurality of directions (which may or may not be the same as used for the earlier low-pass filtering) and thereafter creating an output digital image signal set as a weighted combination of such plurality of further sub-image signal sets. This edge sharpening filter may also be realized using the earlier-mentioned differences between low-pass filtered subimages and the original image—thus further conserving on required filtering resources.

In an exemplary embodiment, both the low-pass and high-pass filtering is performed using linear space-invarient (LSI) filters. Nevertheless, structure adaptive filtering effects are produced by thereafter generating an adaptively weighted combination of such LSI filter outputs. Such usage of LSI filter banks to realize structure adaptive image processing provides not only effective noise reduction but also structure enhancement of MR images while simultaneously permitting efficient implementations using an array processor, parallel signal processing channels, and the like.

Although the LSI filters may be operated in virtually any number of different directions permitted by the digital image array size, a presently preferred effective and efficient implementation utilizes LSI filtering in only four directions which are oriented at substantially 45° angular intervals within the image space. One example of a suitable LSI low-pass filter generates for each pixel a weighted combination of a predetermined number of its nearest neighbors along a line parallel to the direction of that particular filter. An exemplary LSI high-pass filtering is preferably nonsymmetric with respect to both spatial direction and polarity—and may also be effected as a weighted combination of a predetermined number of nearest neighbors along a line parallel to the filter direction.

The exemplary filter provides exceptionally fast magnetic resonance (MR) image processing by effecting what may be close to a minimum modification to the original image structures while yet performing noise smoothing at a given filtering level. The filtered image is a weighted combination of the pixels in four subimages obtained from low-pass filtering the original image along four major directions. The weighting on each subimage pixel is controlled by the differences between pixels in these subimages and a corresponding pixel in the original image. The resulting image is then non-symmetrically sharpened to enhance the structural boundaries of imaged tissues. The overall effect provides adaptive noise reduction and edge enhancement with an efficient implementation using array processors. The high regularity and parallelism of the filter also makes it suitable for efficient implementation using very large scale integrated (VLSI) circuits or multi-processor systems. The performance of the filter in reducing image noise and preserving important imaged tissue structures is demonstrated below using several MR images from a low-field-strength MR imaging system.

Like many other adaptive filters, the exemplary filter of this invention attempts to reduce image noise while yet preserving important image structures. Here, this goal of minimizing modification to the original true image (i.e., the theoretical noiseless perfect image) is approached by choosing filter parameters which produce a predetermined constrained smoothing level in homogeneous areas of images. The preferred embodiments avoid conventional image analysis as typically used in adaptive filtering (e.g., such as edge detection using gradient or Laplacian operators and image model identification) and which involve resource consuming computations. The initial noise-smoothed filtered image is produced as a weighted combination of four subimages obtained from low-pass filtering the original image along four major directions. These low-pass filtering operations in each direction are non-adaptive and thus they can be very efficiently implemented using array processors. The resulting image nevertheless provides adaptive smoothing with due respect for preserving true tissue image structures since weighting parameters for synthesizing the final low-pass image are controlled by the differences between these subimages and the original image. These differences provide information about image structures and thus provide structure adaptive filtering. Therefore, image structures can be preserved while image noise is effectively reduced. Furthermore, since the filtering process has a highly parallel structure, it can be implemented using multiple synchronized microprocessors or VLSI circuits to further speed up the processing. As a result, the filter can be useful for fast noise reduction in MR and other medical imaging applications. Preferably, a non-symmetric edge sharpening filter is also utilized for image structure boundary enhancement prior to providing a final composite filter output.

BRIEF DESCRIPTION OF THE DRAWINGS

These, as well as other objects and advantages of this invention will be more completely understood and appreciated by careful study of the following more detailed description of presently preferred exemplary embodiments of this invention taken in conjunction with the accompanying drawings, of which.

DETAILED DESCRIPTION OF EXEMPLARY EMBODIMENTS

Figure 1:
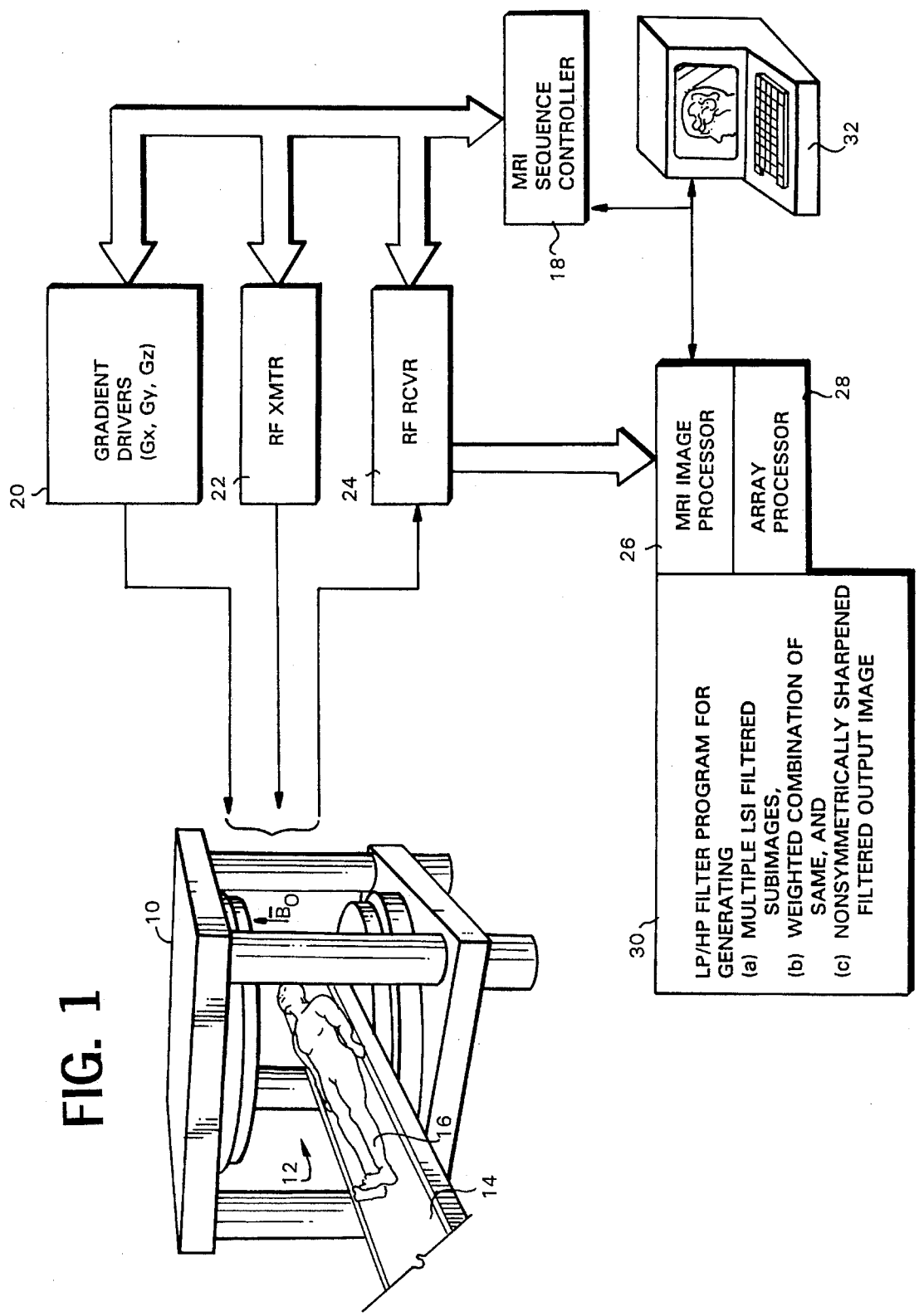
FIG. 1 is a schematic overview of an MRI system modified so as to provide filtering in accordance with an example of this invention.

FIG. 1 depicts a typical conventional MRI system that has been adapted so as to practice an exemplary embodiment of this invention. One example of such system is the Toshiba ACCESS™ MRI system. For example, it may comprise a rather large NMR polarizing magnet structure 10 which generates a substantially uniform homogeneous NMR polarizing magnetic field $B_O$ within a patient imaging volume 12. A suitable carriage 14 is used for inserting the desired portion of patient 16 anatomy within the image volume 12. Magnetic NMR gradients in $B_0$ can be selectively created by electromagnet gradient coils, NMR RF mutation pulses can be transmitted into the patient tissue within the image volume and NMR RF responses can be received from the patient tissue via suitable RF coil structures as will be appreciated by those in the art. A particular MRI data acquisition sequence of such magnetic gradient pulses, RF nutation pulses and NMR RF responses is conventionally achieved by an MRI sequence controller 18 controlling the usual array of gradient drivers 20, RF transmitter circuits 22 and RF receiver circuits 24, all suitably interfaced with electromagnetic and RF coils within the MRI system gantry. The received NMR RF responses are digitized and passed to an MRI image processor 26 which typically includes an array processor 28 and suitable computer program storage media 30 (e.g., RAM in silicon or magnetic media) wherein programs are stored and selectively utilized so as to control the processing of acquired MR image data to produce digitized image displays on the CRT terminal 32. The control terminal 32 may also include suitable keyboard switches and the like for exerting operator control over the MRI sequence controller 18 and the interconnected cooperating MR image processor 26.

In conjunction with the usual MRI processor 26, an operator is typically presented with a menu of choices. In the exemplary embodiment of this invention, one of those choices available to the operator would be "refinement" or filtering of an MR image. In the preferred exemplary embodiment, a default set of filter parameters is provided for general usage. However, if desired, different sets of filter parameters may be chosen (possibly from a predetermined array of filter parameter sets) so as to provide the operator with some filtering alternatives that may provide better results in the case of a particular type of medical image.

To refine the image by reducing high-frequency random noise components in the image, low-pass filters are necessary. But linear space invariant (LSI) low-pass filters may blur important image structures, such as transversely oriented edges and lines, and thus reduce the image contrast. To overcome this problem, space variant (i.e., structure adaptive) filters are required. Ideally, such filters should perform strong low-pass filtering only along (i.e., parallel to) edges and lines and in homogeneous (i.e., non-structured) areas of images. In the exemplary embodiment, a fast noise reduction process is implemented using a bank of four oriented LSI low-pass filters. Overall, structure adaptive filtering nevertheless is realized in the final filter output by forming a weighted combination of the four subimages from this filter bank.

Figure 2:
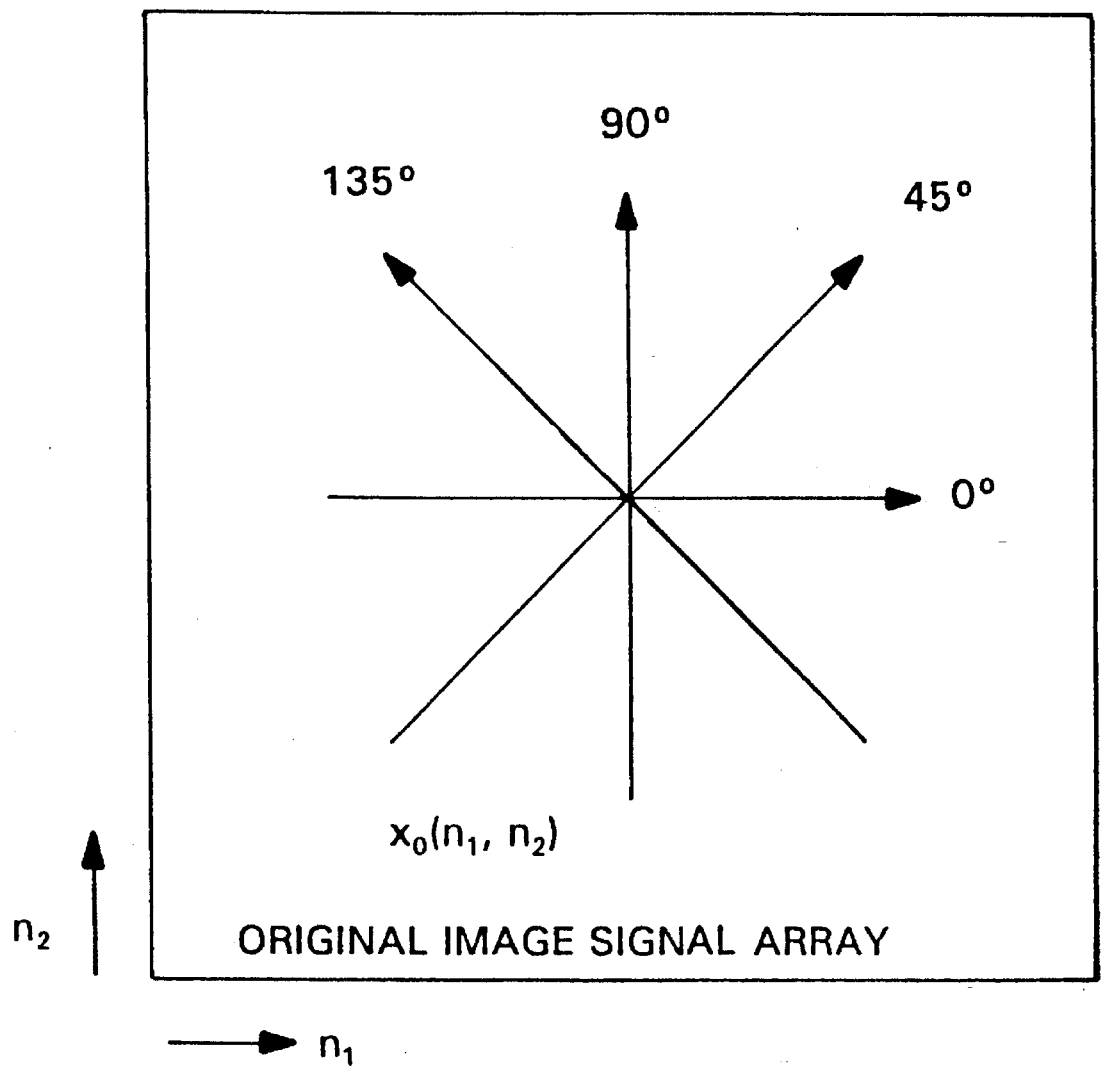
FIG. 2 illustrates an exemplary orientation of four major filtering directions for use with LSI low-pass and high-pass filtering in accordance with the FIG. 1 example of this invention.

Given the original image $x_0(n_1, n_2)$ of FIG. 2, four low-pass filters are used to obtain four low-pass filtered subimages $x_{f1-4}$ along four major directions (0°, 45°, 90°, 135°):

$$x_{f1}(n_1,n_2) = f_{l1}(x_0(n_1,n_2)) \quad x_{f2}(n_1,n_2) = f_{l2}(x_0(n_1,n_2))$$
$$x_{f3}(n_1,n_2) = f_{l3}(x_0(n_1,n_2)) \quad x_{f4}(n_1,n_2) = f_{l4}(x_0(n_1,n_2))$$

EQUATIONS (1)

The function $f_{li}$ represents a low-pass filter function to be performed along the ith direction, where the index i=1, 2, 3 or 4 corresponds to 0, 45, 90 or 135 degrees, respectively. These filters can be realized as conventional LSI low-pass filters. Each of the four filters is assumed to have the same filtering "strength" (e.g., as defined by the number of pixels used for smoothing or specified by the low-pass filter bandwidth). For example, if four nearest neighboring pixels around the position $(n_1, n_2)$ are used together with the pixel at that location (i.e., a total of five pixels, are used in the filter window) for low-pass filtering, a group of simple low-pass filters can be implemented in the image domain to produce four corresponding subimages:

$$x_{f1}(n_1,n_2) = \Sigma_{i=-2}^{+2} \alpha_i \cdot x_0(n_1+i,n_2) \quad x_{f2}(n_1,n_2) = \Sigma_{i=-2}^{+2} \alpha_i \cdot x_0(n_1+i,n_2+i)$$
$$x_{f3}(n_1,n_2) = \Sigma_{i=-2}^{+2} \alpha_i \cdot x_0(n_1,n_2+i) \quad x_{f4}(n_1,n_2) = \Sigma_{i=-2}^{+2} \alpha_i \cdot x_0(n_1+i,n_2-i)$$

EQUATIONS (2)

Adjusting values of the weighting factors $\alpha_i$ will change the characteristic of these filters. For linear phase and normality of the filters, weighting factors $\alpha_i$ are constrained to have the following relationships:

$$\alpha_{+1} = \alpha_{-1} \text{ and}$$
$$\sum_{i=-2}^{+2} \alpha_i = 1$$

EQUATIONS (3)

Such low-pass filters can also be implemented in the frequency domain using array processors with Fast Fourier Transform (FFT) routines. In that case, the filter characteristics can be adjusted by specifying different frequency responses directly in the frequency domain.

Differences of these subimages with the original image are calculated as $$d_1(n_1,n_2) = x_0(n_1,n_2) - x_{f1}(n_1,n_2) \quad d_2(n_1,n_2) = x_0(n_1,n_2) - x_{f2}(n_1,n_2)$$
$$d_3(n_1,n_2) = x_0(n_1,n_2) - x_{f3}(n_1,n_2) \quad d_4(n_1,n_2) = x_0(n_1,n_2) - x_{f4}(n_1,n_2)$$

EQUATIONS (4)

The absolute values of these image differences are herein expressed as:

$$\bar{d}_1 = |d_1|, \bar{d}_2 = |d_2|,$$
$$\bar{d}_3 = |d_3|, \bar{d}_4 = |d_4|$$

EQUATION (5)

The argument $(n_1, n_2)$ has been omitted in these equations to conserve space, and this is also done in some following expressions for the same reason.

Upon reflection, it will be appreciated that the values of these image differences depend on image tissue structures. When low-pass filtering $f_{li}(x_0(n_1, n_2))$ is performed along edges or lines, these image structures are smoothed and well preserved in the output $x_{li}(n_1, n_2)$ and, therefore, the resulting filtered image pixel value $x_{li}(n_1, n_2)$ will exhibit but a small difference with the corresponding original image pixel value $x_0(n_1, n_2)$. Outputs from such aligned low-pass filters thus provide a good smoothed approximation to the original image in these image areas. However, when low-pass filtering is performed across edges or lines, these structures are severely distorted and therefore the resulting image pixel value $x_{li}(n_1, n_2)$ will exhibit a relatively large difference with the corresponding original image pixel value $x_0(n_1, n_2)$. The values of these differences are also dependent on the "strengths" (i.e., bandwidths) of the low-pass filters. Stronger (i.e., narrower bandwidth, larger numbers of pixels in an averaging window) low-pass filtering results in smoother images and thus bigger difference values. Since these image differences provide information about structures in the original image (i.e., information about similarities of the subimages to the original image), one can synthesize a smoothed approximation of the original image from these four subimages, controlled by the image differences and constrained by a desired degree of filtered output smoothness in homogeneous image areas. The smoothness of a filtered image of a known homogeneous phantom, for example, can be evaluated by measuring standard deviations (SD) of the image in these known homogeneous image areas. This demanded degree of smoothness then determines the required minimum filtering strength (i.e., maximum bandwidth) of the low-pass filters.

A structure adaptive low-pass processed image output $x_{l0}(n_1, n_2)$ may now be synthesized as a weighted combination of the above-discussed four subimages:

$$x_{l0} = w_{l1} \cdot x_{l1} + w_{l2} \cdot x_{l2} + w_{l3} \cdot x_{l3} + w_{l4} \cdot x_{l4} \quad \text{EQUATION (6)}$$

where $w_{l1}, w_{l2}, w_{l3}, w_{l4}$ ($0 \leq w_{li} \leq 1$) are weighting parameters respectively associated with the four low-pass filtered subimages and they may be determined as functions $g_{li}(d_1, d_2, d_3, d_4)$ of the image differences. For keeping the same mean values of the low-pass filtered image $x_{l2}(n_1, n_2)$ and the original image $x_0(n_1, n_2)$, these parameters should have the following relationship:

$$w_{l1}(n_1,n_2) + w_{l2}(n_1,n_2) + w_{l3}(n_1,n_2) + w_{l4}(n_1,n_2) = 1, \text{ for all}(n_1,n_2) \quad \text{EQUATION (7)}$$

From previous discussion about the relationship of image structures and image differences, to preserve desired image structures, a subimage having a smaller difference from the original image should provide a relatively greater contribution to the final synthesized image. Therefore, the weighting parameters $w_{li}(n_1, n_2)$ should be monotonically decreasing functions of the corresponding image difference $\bar{d}_i(n_1, n_2)$. One form of them is $w_{li} = s_i/\bar{d}_i^k$ where $s_i$ is a scaling factor chosen to satisfy equation (7) and where the superscript k represents a power parameter for the filter. For simple computation of $\bar{d}_i^k$, the parameter k may be chosen as positive integer. Considering the constraint of equation (7), the weighting parameters can be determined from the image differences as $$w_{li} = g_{li}(d_1,d_2,d_3,d_4) = \frac{\frac{1}{\bar{d}_i^k}}{\frac{1}{\bar{d}_1^k} + \frac{1}{\bar{d}_2^k} + \frac{1}{\bar{d}_3^k} + \frac{1}{\bar{d}_4^k}},$$
for $i = 1,2,3,4$ \quad EQUATION (8)

Therefore, these weighting parameters have the following relations $$w_{l1} \propto \frac{1}{\bar{d}_1^k}$$
$$w_{l2} \propto \frac{1}{\bar{d}_2^k}$$
$$w_{l3} \propto \frac{1}{\bar{d}_3^k}$$
$$w_{l4} \propto \frac{1}{\bar{d}_4^k}$$
\quad EQUATIONS (9)

By substituting equation (8) into equation (6), the synthesized structure adaptive low-pass filtered image can be explicitly expressed as $$x_{l0} = \frac{\frac{1}{\bar{d}_1^k} x_{l1} + \frac{1}{\bar{d}_2^k} x_{l2} + \frac{1}{\bar{d}_3^k} x_{l3} + \frac{1}{\bar{d}_4^k} x_{l4}}{\frac{1}{\bar{d}_1^k} + \frac{1}{\bar{d}_2^k} + \frac{1}{\bar{d}_3^k} + \frac{1}{\bar{d}_4^k}} \quad \text{EQUATION (10)}$$

The filter thus effects a reduced or minimum modification to the original image data (and thus preserves image structures) by "choosing" weighted data from the outputs of four oriented low-pass filters while keeping a certain predetermined filtering (smoothing) level in homogeneous image areas. For example, if pixel $x_0(n_1, n_2)$ is on an edge or a line along the 0° direction, then the output $x_{l1}(n_1, n_2)$ from the first filter $f_{l1}(n_1, n_2)$ will have much smaller difference from $x_0(n_1, n_2)$ at the position $(n_1, n_2)$ than will outputs from other three filters. That is, $\bar{d}_1 << \bar{d}_i$ for $i=2, 3, 4$. From equation (10), $x_{l0}(n_1, n_2) \approx x_{l1}(n_1, n_2)$ at this position. At the same time, if the pixel $x_0(n_1, n_2)$ is in a homogeneous image area, $\bar{d}_1 \approx \bar{d}_2 \approx \bar{d}_3 \approx \bar{d}_4$ and, from equation (10), the final output $x_{l0}$ will be approximately $\frac{1}{4}(x_{l1} + x_{l2} + x_{l3} + x_{l4})$, or the average of outputs from all four low-pass filters. Thus, although each low-pass filter is non-adaptive by itself and each output subimage therefore is highly smoothed along its respective direction, the overall filter is adaptive to image structures and the synthesized image is only strongly smoothed in homogeneous regions and along edges and lines of the image structures. Therefore, the filter can effectively reduce noise while also yet preserving important image structures. The filtering performance can be adjusted by the parameters $\alpha_i$ of the low-pass filters $f_{li}$ and k of the weighting factors $w_{li}$. A larger parameter k makes the filtering process more sensitive to image differences and thus more sensitive to image structures. Stronger low-pass filtering (e.g., choosing $\alpha_i$ to average together more pixels) in each direction provides smoother final images.

The exemplary filter is very similar in form to a maximum likelihood estimator of a value x from four measurements $x_{li}$ for $i=1, 2, 3, 4$ when $x_{li}$ are Normal distributed with the mean x and the standard deviations $\bar{d}_i$, respectively (e.g., see L. L. Scharf, *Statistical Signal Processing: Detection, Estimation, and Time Series Analysis*, Addison-Wesley Publishing Co., 1990). It is also interesting to note the similarity of this image filtering process with image interpolation. Consider the original image $x(n_1, n_2)$ and the four subimages $x_{li}(n_1, n_2)$ as five points in an image space. The distances from the original image point to the four subimage points are $\bar{d}_1$, $\bar{d}_2$, $\bar{d}_3$ and $\bar{d}_4$, respectively. From equation (10), when k=1, the final low-pass filtered image is:

$$x_{l0} = \frac{\frac{1}{\bar{d}_1} x_{l1} + \frac{1}{\bar{d}_2} x_{l2} + \frac{1}{\bar{d}_3} x_{l3} + \frac{1}{\bar{d}_4} x_{l4}}{\frac{1}{\bar{d}_1} + \frac{1}{\bar{d}_2} + \frac{1}{\bar{d}_3} + \frac{1}{\bar{d}_4}} \quad \text{EQUATION (11)}$$

As may be appreciated, for this case it is a linear interpolation of four subimages $x_{li}$ $(n_1,n_2)$, i=1, 2, 3, 4. This is the smoothest approximation to the original image from the filtering process. By contrast, if k→+∞:

$$x_{l0}(n_1,n_2) = x_{li}(n_1,n_2),$$
$$\text{if } \bar{d}_i(n_1,n_2) < \bar{d}_j(n_1,n_2) \quad \text{EQUATION (12)}$$

In this case, the low-pass filtered image is determined by a nearest neighbor interpolation process and the filtering approaches a binary selection process from outputs of the filter bank. It is noted that the filter now becomes a directional averaging filter (e.g., as discussed in A. K. Jain, Fundamentals of Digital Image Processing, Prentice Hall, Englewood Cliffs, N.J. 07632,1989) for four directions. Although the filter defined by equation (12) gives a minimum image difference by choosing only one of four subimages, the resultant smoothing is often not adequate in non-textured image areas. Since only an output from the filter with minimum $\bar{d}_i$ is used for this low-pass filtering, only five pixels (instead of seventeen) are utilized to smooth noise (even in homogeneous image areas). Increasing the number of pixels used in the filter equation (12) to achieve the same filtering strength as that given by equation (10) in non-textured image areas will affect the sensitivity of the filter to image structures. Thus, the filter structure of equation (10) provides a better edge preserving solution to the noise reduction problem than does the filter defined by equation (12).

Figure 3:
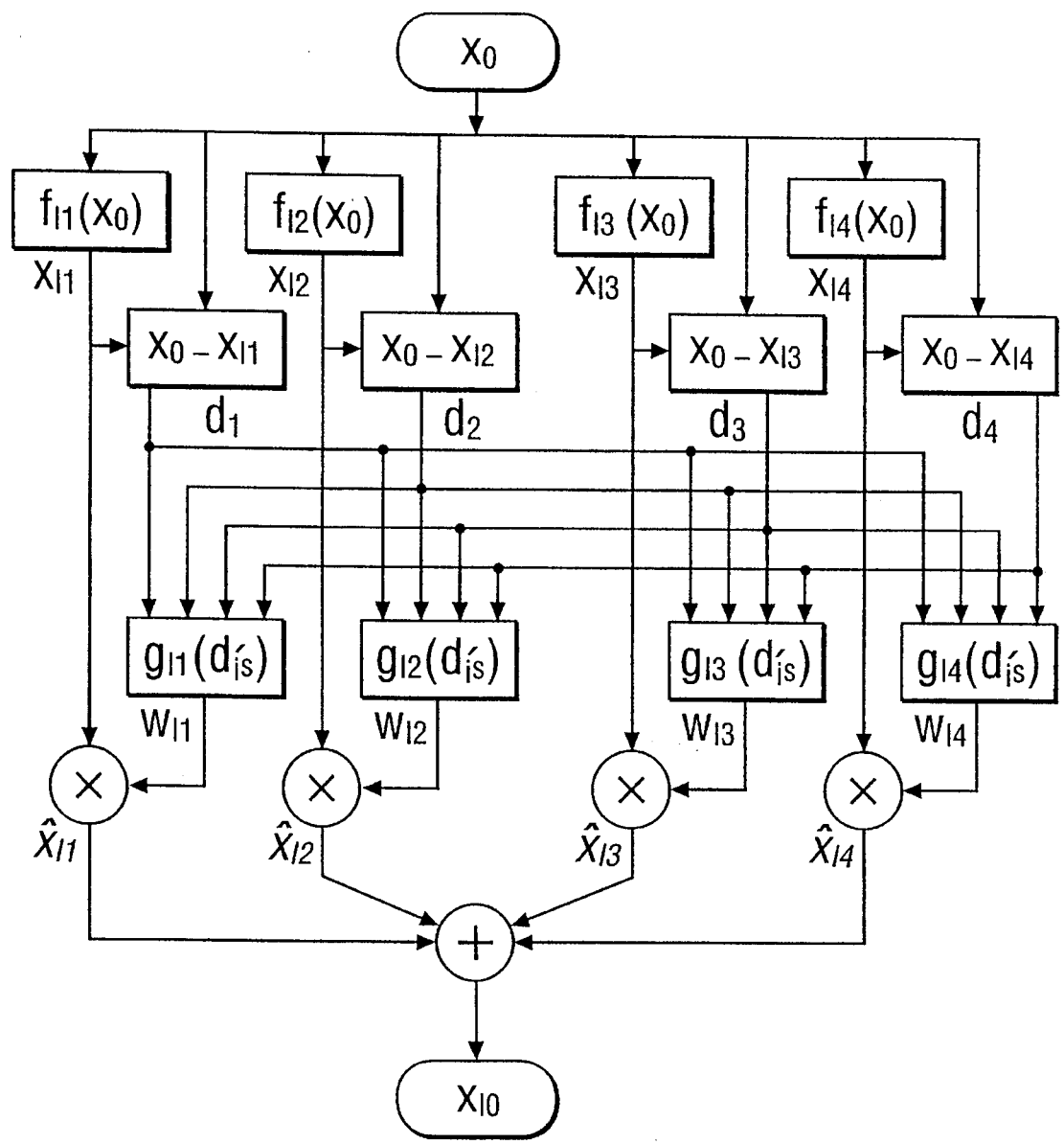
FIG. 3 is a schematic depiction of an exemplary adaptive low-pass image filter for use with this invention.

An example of this new filtering scheme is pictorially shown in FIG. 3 where $\hat{x}_{li} = w_{li} \cdot x_{li}$ is the weighted output from each low-pass filter channel. Since each low-pass filter is linear space invariant, the same operation is performed on many arrays of data. The operations for image difference calculation, weighting parameter determination and final image syntheses are also global in nature. Therefore, array processors can be used for efficient implementation of this filter. It can be seen that this filter has a regular computation structure and thus it is suitable for VLSI hardware implementation. The filter also has high parallelism and is therefore easy to be implemented in a multiple microprocessor environment.

When images are processed for human viewers, it is often desirable to sharpen image edges for more aesthetically pleasing views—and, perhaps to provide more correct diagnostic analyses. The most commonly used approach is called "unsharp" masking. It is implemented by passing an image through a high-pass filter and then adding a fraction of its output to the original image. Although this conventional approach yields reasonably good results in many cases, some undesired new image noise is also generated, especially when the input image has a low signal-to-noise ratio (SNR). Another problem with this approach is that overshoots of bright image edges may be produced when relatively strong sharpening is applied.

Figure 4:
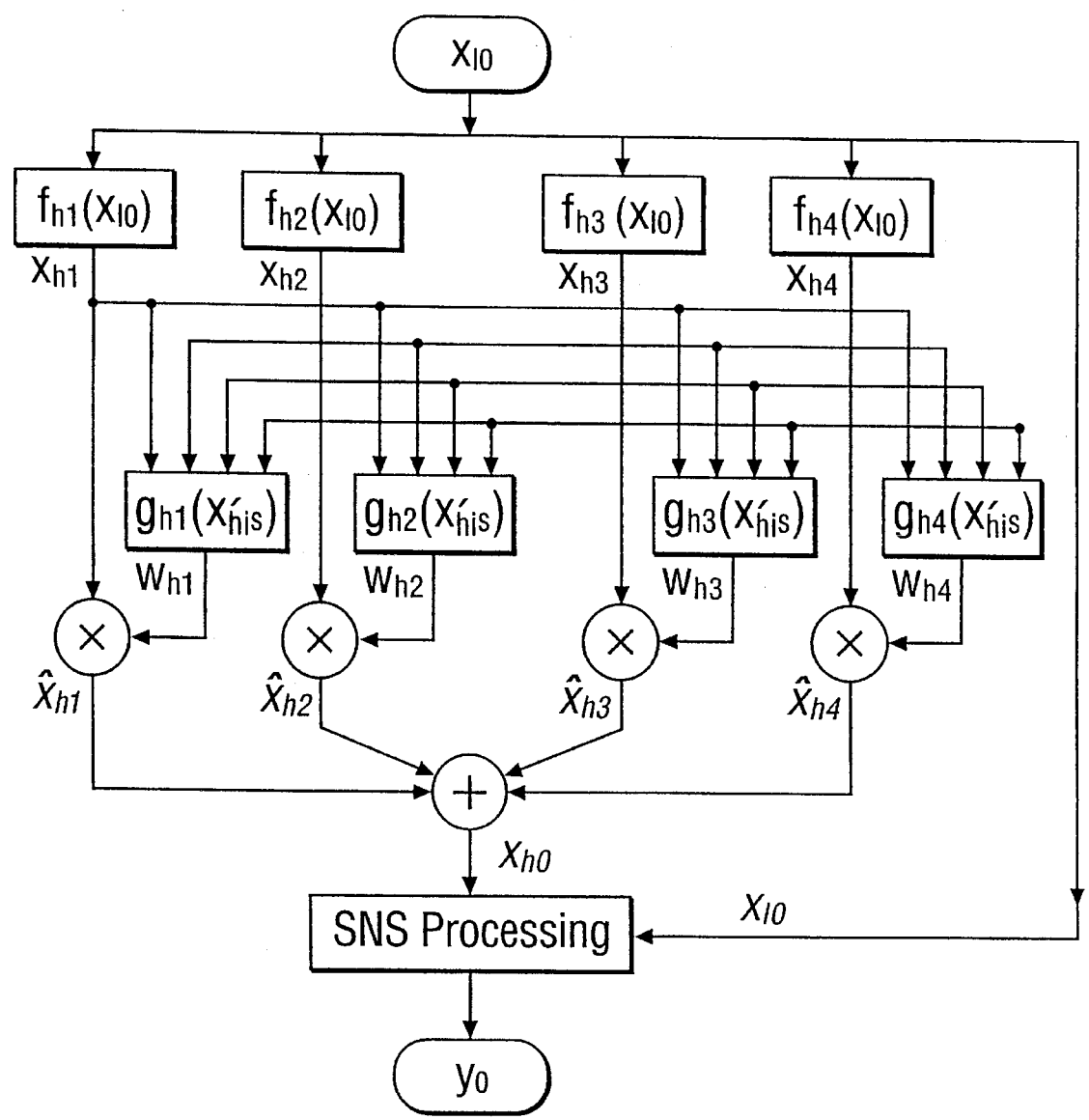
FIG. 4 is a schematic depiction of a non-symmetric edge sharpening filter for use in this invention.

A non-symmetric edge sharpening method is therefore preferred for use with this invention to cope with this problem. The sharpening filter is preferably nonsymmetric both with respect to the spatial direction and with respect to the positive/negative sign of enhancement signals. An example of such an edge sharpening scheme is depicted in FIG. 4. The image data $x_{l0}(n_1,n_2)$ from the adaptive low-pass filter of FIG. 3 is high-pass filtered along four directions (which may or may not be the same as used in the prior substantially independent FIG. 3 low-pass filter process) to obtain further subimage outputs $x_{h1}(n_1,n_2)$, $x_{h2}(n_1,n_2)$, $x_{h3}(n_1,n_2)$ and $x_{h4}(n_1,n_2)$. That is:

$$x_{h1}(n_1,n_2) = f_{h1}(x_{l0}(n_1,n_2)) \quad x_{h2}(n_1,n_2) = f_{h2}(x_{l0}(n_1,n_2))$$
$$x_{h3}(n_1,n_2) = f_{h3}(x_{l0}(n_1,n_2)) \quad x_{h4}(n_1,n_2) = f_{h4}(x_{l0}(n_1,n_2)) \quad \text{EQUATIONS (13)}$$

where $f_{h1}, f_{h2}, f_{h3}$, and $f_{h4}$ are LSI high-pass filters performed along the major directions of 0, 45, 90 and 135 degrees, respectively. Similar to the low-pass filtering case, these filters can be implemented using array processors in the image domain directly or in the frequency domain. Then the weighted summation of the resulting four high-pass subimages is obtained as $$x_{h0} = w_{h1} \cdot x_{h1} + w_{h2} \cdot x_{h2} + w_{h3} \cdot x_{h3} + w_{h4} \cdot x_{h4} \quad \text{EQUATION (14)}$$

The weighting parameters $w_{hi}$ are determined as functions of outputs of these high-pass filters and are constrained to have the relation:

$$w_{h1}(n_1,n_2) + w_{h2}(n_1,n_2) + w_{h3}(n_1,n_2) + w_{h4}(n_1,n_2) = 1, \text{ for all}(n_1,n_2) \quad \text{EQUATION (15)}$$

To emphasize high amplitude components from the cross edge direction (contrary to the low-pass filtering case), these weighting parameters should be some monotonically increasing functions of the amplitudes of the corresponding subimages. A simple form may be $w_{hi} = s_h \cdot |x_{hi}|^j$ where $s_h$ is a scaling factor chosen to satisfy the constraint of equation (15) and the superscript j denotes a power parameter of the high-pass filter. Again, for simple computations, the parameter j may be a positive integer. Using this function and considering equation (15), the weighting parameters may be determined by $$w_{hi} = g_{hi}(x_{h1}, x_{h2}, x_{h3}, x_{h4}) = \frac{|x_{hi}|^j}{|x_{h1}|^j + |x_{h2}|^j + |x_{h3}|^j + |x_{h4}|^j},$$
$$\text{for } i = 1, 2, 3, 4 \quad \text{EQUATION (16)}$$

where the power parameter j can be used to adjust performance of the filter. Using equation (16) and equation (14), the combined high-pass filtered image data can be explicitly expressed as:

$$x_{h0} = \frac{|x_{h1}|^j \cdot x_{h1} + |x_{h2}|^j \cdot x_{h2} + |x_{h3}|^j \cdot x_{h3} + |x_{h4}|^j \cdot x_{h4}}{|x_{h1}|^j + |x_{h2}|^j + |x_{h3}|^j + |x_{h4}|^j} \quad \text{EQUATION (17)}$$

The output $w_{hi} \cdot x_{hi}$ from each filter channel is represented by $\hat{x}_{hi}$ in FIG. 4.

This filter selectively emphasizes high amplitude and high frequency components from the high-pass filters in directions oriented across (i.e., transverse to) image structure edges. Filter outputs with higher amplitudes provide bigger contributions to the final enhancement signal and a larger parameter j makes this selection process more sensitive to amplitudes of the high-pass filter outputs in different directions. Using this weighting process, image edges can be enhanced nonsymmetrically in four directions without much offsetting the prior low-pass filtering operation along edges. As a special case, when j→+∞ only an output from the filter having the highest amplitude is effectively selected for edge enhancement as $$\left.\begin{array}{l} x_{h0}(n_1,n_2) = x_{hm}(n_1,n_2), \\ \text{if} \\ |x_{hm}(n_1,n_2)| > |x_{hn}(n_1,n_2)| \end{array}\right\} \quad \text{EQUATION (18)}$$

It has also been noted that the difference components $d_i$ from equation (4) may be used instead of $x_{hi}$ in equations (16) and (17) for determining the weighting parameters and final high-pass output. Then the high-pass filtered image for edge enhancement is:

$$x_{h0} = \left.\frac{|d_1|^{ij} \cdot d_1 + |d_2|^{ij} \cdot d_2 + |d_3|^{ij} \cdot d_3 + |d_4|^{ij} \cdot d_4}{|d_1|^{ij} + |d_2|^{ij} + |d_3|^{ij} + |d_4|^{ij}}\right\} \quad \text{EQUATION (19)}$$

Thus, in this case, much of the computation required for high-pass filtering is eliminated. However, note that now the high-pass image $x_{h0}$ cannot be independently adjusted since $d_i$ are determined by the parameter specifications of the low-pass filters.

To enhance boundaries between different image structures and to prevent overshoots of bright image edges in MRI, the output $x_{h0}(n_1,n_2)$ from the above, direction selective, high-pass filter could be further processed with a simple sign nonsymmetric (SNS) function defined as $$\hat{x}_{h0}(n_1,n_2) = x_{h0}(n_1,n_2) - w_n \cdot |x_{h0}(n_1,n_2)|\} \quad \text{EQUATION(20)}$$

where $w_n$ is a sign non-symmetric weighting parameter. If so, the SNS processed high frequency components $\hat{x}_{h0}(n_1, n_2)$ vary with the signs of $x_{h0}(n_1,n_2)$. When the parameter $w_n$ is chosen in the range of $0 \leq w_n \leq 1$:

$$\left.\begin{array}{l} x_{h0}(n_1,n_2) - w_n \cdot |x_{h0}(n_1,n_2)| = \\ \left\{ \begin{array}{l} (1-w_n) \cdot x_{h0}(n_1,n_2) \text{ if } x_{h0}(n_1,n_2) \geq 0 \\ (1+w_n) \cdot x_{h0}(n_1,n_2) \text{ if } x_{h0}(n_1,n_2) < 0 \end{array} \right. \end{array}\right\} \quad \text{EQUATION (21)}$$

Therefore, by choosing $w_n$, one can make stronger edge enhancement using non-symmetric high-pass signal and obtain clearer structure boundaries without introducing bright edge overshoots. Finally, a fraction of these SNS processed high frequency components $\hat{x}_{h0}(n_1, n_2)$ can be added to the low-pass processed image $x_0(n_1,n_2)$ to obtain the final noise smoothed and edge enhance image $y_0(n_1, n_2)$:

$$y_0(n_1,n_2) = x_{l0}(n_1,n_2) + w_e \cdot \hat{x}_{h0}(n_1,n_2)\} \quad \text{EQUATION (22)}$$

where $w_e$ is the edge enhancement weighting factor. From FIG. 4 it can be seen that this sharpening scheme also has high regularity and parallelism and therefore is also suitable for VLSI or multi-processor implementation.

Figure 5:
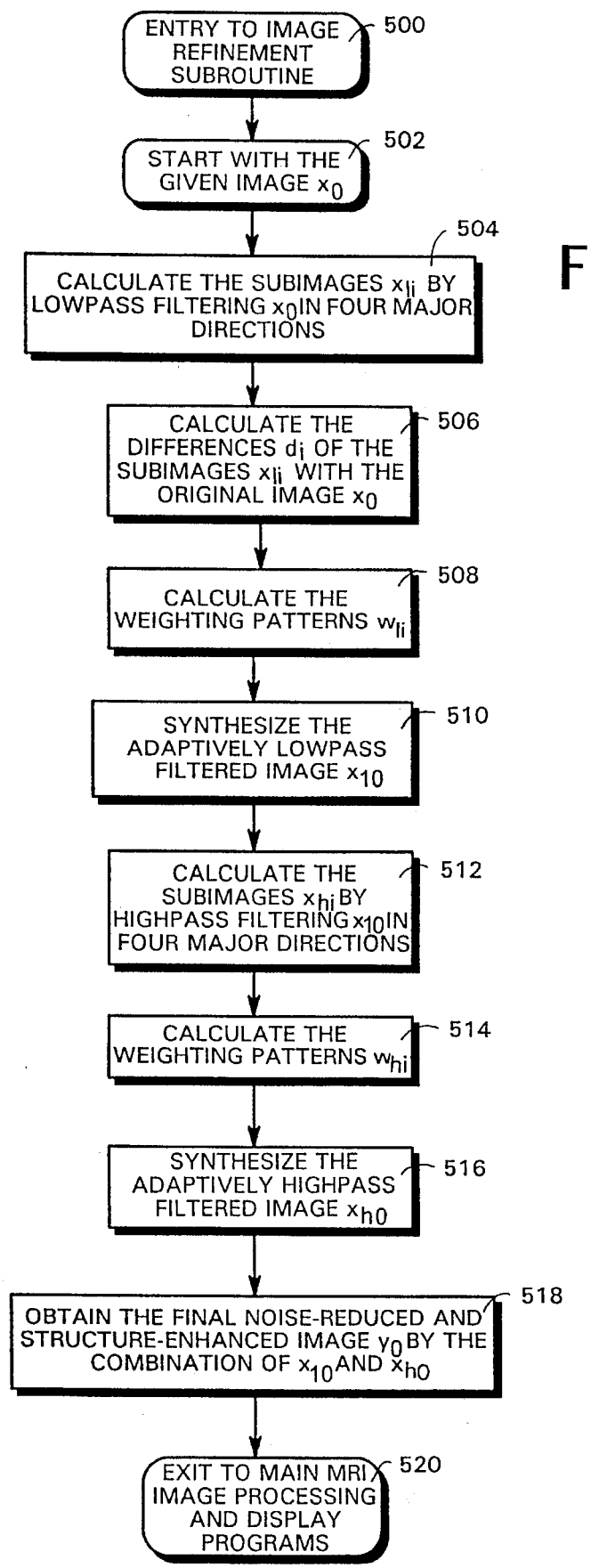
FIG. 5 is a simplified flowchart of a suitable computer program subroutine that may be used in the MRI system of FIG. 1 so as to practice an exemplary embodiment of filtering in accordance with this invention.

A flowchart for a sequentially implemented computer program implementation of the exemplary embodiment of this invention in an MRI system is depcited in FIG. 5. Assuming that the "refinement" menu option has been selected, then entry to this subroutine will be made at 500. The existing (e.g., conventional MR) image is accessed by the subroutine at 502, and the low-pass filtered subimages in four major directions are calculated at 504. Thereafter, the differences of the subimages with respect to the original filter input image are generated at 506. The bandwidth of the low-pass filtering in step 504, as well as the weighting patterns generated at 508 are, of course, determined by the selected filter parameter set (e.g., either the default set selected for general purposes or one of the redefined available parameter sets that may be chosen by the operator as part of the menu of choices). The adaptively low-pass filtered image is then synthesized at 510. Thereafter, the high-pass filtered subimages in four major directions are generated at 512, suitable weighting patterns are generated at 514 (again, in dependence upon the filter parameter set chosen for use). The adaptively high-pass filtered image is then generated at 516 and combined with the adaptively low-pass filtered image at 518 to provide the final noise reduced and structure enhanced filter output image. Thereafter, the subroutine is exited at 520 so as to return to the main MR image processing and display programs and menu choices.

Figure 6:
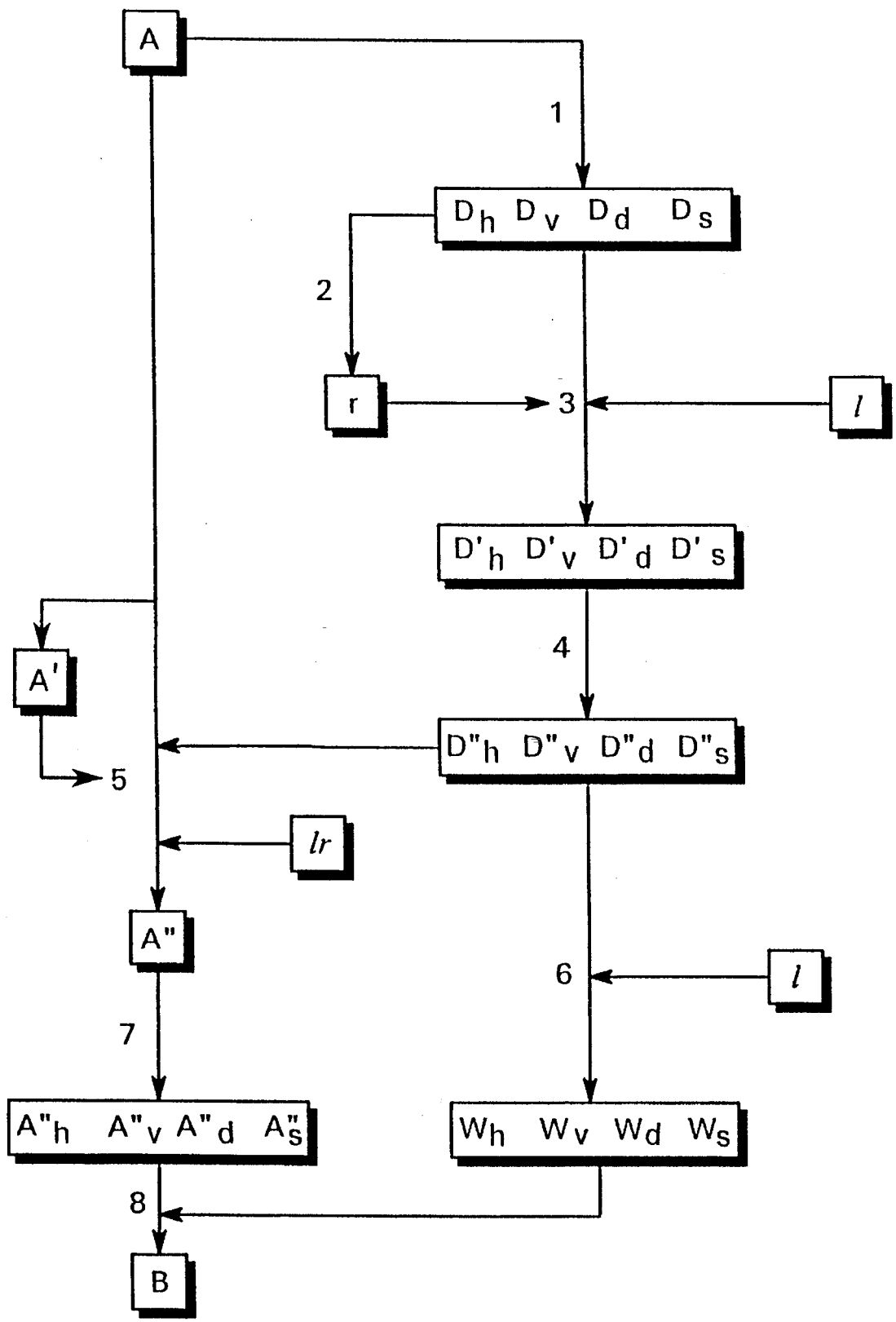
FIG. 6 is a diagram of an exemplary implemented embodiment of the invention.

One presently preferred embodiment of this invention has been implemented on μ-Vax/VMS with a Worrier array processor in a Toshiba ACCESS™ MRI system. The filter programming is written for two-dimensional images and it can be generated for three-dimensional images. A diagram of this filter is shown at FIG. 6.

All of the image patterns used in the implemented filter have the same size. They have N columns and M rows. In most cases, N=M=256. Image patterns are denoted by bold capital letters(such as U) describing this particular filter hereinbelow. The pixel of image U at the location of i-th column and j-th row is denoted by U(ij) with $1 \leq i \leq N$ and $1 \leq j \leq M$.

In the implemented filter, images are sometimes filtered by one-dimensional convolution along one of the four particularly chosen directions. These four directions are the horizontal direction, the vertical direction, the main-diagonal direction and the sub-diagonal direction. The filters and filtered image patterns along these directions are labeled by subscripts h, v, d, and s, respectively. For example, given a kernel of length 5, say, $$\left\{ \frac{\omega}{(1.0+4\times\omega)}, \frac{\omega}{(1.0+4\times\omega)}, \frac{1.0}{(1.0+4\times\omega)}, \frac{\omega}{(1.0+4\times\omega)}, \frac{\omega}{(1.0+4\times\omega)}, \right\}$$

where ω is a real number, the one-dimensional convolution to an image U along the horizontal direction is defined by $$U_h(i,j) = \frac{1.0}{(1.0+4\times\omega)} (\omega U(i-2,j) +$$

$$\omega U(i-1,j) + U(i,j) + \omega U(i+1,j) + \omega U(i+2,j))$$

for each i, j, and is denoted by $$U_h = Conv_h(U)$$

Also, for completion, the one-dimensional convolution to an image U along the vertical direction, the main-diagonal direction and the sub-diagonal direction with the given kernel is defined by $$U_v(i,j) = \frac{1.0}{(1.0+4\times\omega)} (\omega U(i,j-2) +$$

$$U(i,j-1) + U(i,j) + \omega U(i,j+1) + \omega U(i,j+2))$$

$$U_d(i,j) = \frac{1.0}{(1.0+4\times\omega)} (\omega U(i-2,j-2) +$$

$$\omega U(i-1,j-1) + U(i,j) + \omega U(i+1,j+1) + \omega U(i+2,j+2))$$

$$U_s(i,j) = \frac{1.0}{(1.0+4\times\omega)} (\omega U(i+2,j-2) +$$

$$\omega U(i+1,j-1) + U(i,j) + \omega U(i-1,j+1) + \omega U(i-2,j+2))$$

for each i, j, and is denoted by $$U_v = Conv_v(U), \ U_d = Conv_d(U), \ U_s = Conv_s(U)$$

respectively.

In the current implementation, there are eight filter levels. The filter level k can be chosen from a Reconstruction Menu. Refine_letter: L=P, Q, R, S, T, U, V, W corresponds to filter level: l=1, 2, 3, 4, 5, 6, 7, 8, respectively. An example of this implemented adaptive filter will hereinafter be described for a two-dimensional image A of size N by M and filter level 1.

First, the four absolute local difference patterns are calculated by effecting one-dimensional convolution along the four different directions followed by generating an absolute value for each pixel:

$$D_h = Abs(Conv_h(A))$$

$$D_v = Abs(Conv_v(A))$$

$$D_d = Abs(Conv_d(A))$$

$$D_s = Abs(Conv_s(A))$$

The convolution kernel is the same for each direction. It is:

$$\left\{ \frac{\omega}{(1.0+4\times\omega)}, \frac{\omega}{(1.0+4\times\omega)}, \frac{1.0}{(1.0+4\times\omega)} - 1.0, \frac{\omega}{(1.0+4\times\omega)}, \frac{\omega}{(1.0+4\times\omega)} \right\}$$

where $\omega=0.5$. The Abs operator is defined by:

$$V=Abs(U); \text{ with } V(i,j)=|U(i,j)| \text{ for each } i,j.$$

Next, a threshold value r is calculated as defined by $$r = \frac{1.0}{4NM} \times \sum_{\substack{1 \leq i \leq N \\ 1 \leq j \leq M}} (D_h(i,j) + D_v(i,j) + D_d(i,j) + D_s(i,j))$$

i.e., r is the average value of the four absolute difference patterns.

Thirdly, the difference patterns are adjusted by:

$$D'_h = Max(D_h, \sigma);$$

$$D'_v = Max(D_v, \sigma);$$

$$D'_d = Max(D_d, \sigma);$$

$$D'_s = Max(D_s, \sigma);$$

where $$\sigma = 0.1lr,$$

where l is the filter level and r is the threshold calculated above.

The Max operator is defined by:

$$V=Max(U, \sigma); \text{ with } V(i,j)=\max(U(i,j)\sigma) \text{ for each } i,j.$$

Fourth, the adjusted difference patterns are smoothed by standard two-dimensional 3×3 convolution:

$$D''_h = Conv(D'_h)$$

$$D''_v = Conv(D'_v)$$

$$D''_d = Conv(D'_d)$$

$$D''_s = Conv(D'_s)$$

where the convolution kernel in each direction is $$\left\{ \frac{\omega}{(1.0+2\times\omega)}, \frac{1.0}{(1.0+2\times\omega)}, \frac{\omega}{(1.0+2\times\omega)} \right\}$$

with $\omega=0.25$.

(Note: the fourth step may be omitted. In that case, $D''_h=D'_h, D''_v=D'_v, D''_d=D'_d, D''_s=D'_s$).

Fifth, a non-directional weighted high-pass filtered image A" is obtained by the following steps:

a) a high-pass filtered image A' is obtained by applying a standard two-dimensional 5×5 convolution to the given image A:

$$A'=Conv(A),$$

where the convolution kernel in each direction is $$\left\{ \frac{\omega}{(1.0+4\times\omega)}, \frac{\omega}{(1.0+4\times\omega)}, \frac{1.0}{(1.0+4\times\omega)}, \frac{\omega}{(1.0+4\times\omega)}, \frac{\omega}{(1.0+4\times\omega)} \right\}$$

with $\omega=-0.125\times 2/7=-0.0357$.

b) a weight pattern W is calculated by $$\begin{aligned} W(i,j) &= 1.0 & \text{if } D_m(i,j) \leq 0.9r, \\ &= (lr - D_m(i,j))/(lr - 0.9r) & \text{if } 0.9r < D_m(i,j) < lr, \\ &= 0.0 & \text{if } lr \leq D_m(i,j) \end{aligned}$$

where $$D_m(i,j)=\max(D_h(i,j), D_v(i,j), D_d(i,j), D_s(i,j)) \text{ for each } i \text{ and } j.$$

c) A" is the weighted average of A and A' using weight pattern W, i.e., $$A''(i,j)=A'(i,j)+W(i,j)[A(i,j)-'(i,j)] \text{ for each } i,j.$$

(Note: the fifth step may be omitted. In that case, A" $(i,j)=A(i,j)$.

Sixth, four smoothed images from A" are obtained by applying one-dimensional convolution along the horizontal, vertical, main-diagonal, and sub-diagonal directions, respectively:

$$A''_h = Conv_h(A'')$$

$$A''_v = Conv_v(A'')$$

$$A''_d = Conv_d(A'')$$

$$A''_s = Conv_s(A'')$$

The convolution kernel is the same for each direction. It is $$\left\{ \frac{\omega}{(1.0+4\times\omega)}, \frac{\omega}{(1.0+4\times\omega)}, \frac{1.0}{(1.0+4\times\omega)}, \frac{\omega}{(1.0+4\times\omega)}, \frac{\omega}{(1.0+4\times\omega)} \right\}$$

where $$\omega=0.2+0.1l.$$

Seventh, four weight patterns $W_h$, $W_v$, $W_d$, $W_s$ are calculated by $$W_h(i,j) = \frac{W_h(i,j)^{-4}}{W_h(i,j)^{-4} + W_v(i,j)^{-4} + W_d(i,j)^{-4} + W_s(i,j)^{-4}}$$

$$W_v(i,j) = \frac{W_v(i,j)^{-4}}{W_h(i,j)^{-4} + W_v(i,j)^{-4} + W_d(i,j)^{-4} + W_s(i,j)^{-4}}$$

$$W_d(i,j) = \frac{W_d(i,j)^{-4}}{W_h(i,j)^{-4} + W_v(i,j)^{-4} + W_d(i,j)^{-4} + W_s(i,j)^{-4}}$$

$$W_s(i,j) = \frac{W_s(i,j)^{-4}}{W_h(i,j)^{-4} + W_v(i,j)^{-4} + W_d(i,j)^{-4} + W_s(i,j)^{-4}}$$

Eighth, a 4-directional weighted smoothing image B is calculated as the final output:

$$B(i,j) = W_h(i,j) \times A''_h(i,j) + W_v(i,j) \times A''_v(i,j) + W_d(i,j) \times A''_d(i,j) + W_s(i,j) \times A''_s(i,j)$$

for each i,j.

(Note: the output image B may be processed by another four-directional high-pass adaptive filter as described above).

Some parameters used in the currently implemented filter are:

Step 1: 1-d convolution with kernel of length 5:
{⅙, ⅙, −⅖, ⅙, ⅙};

Step 2: none;

Step 3: σ=0.1lr; for l=1, . . . , 8;

Step 4: 2-d convolution with kernel of length 3 in each direction:
{⅙, ⅘, ⅙}

Step 5:
a) 2-d convolution with kernel of length 5 in each direction:
{−0.0416, −0.0416, 1.1666, −0.0416, −0.0416};
b) soft threshold function with lower cult off side value: 0.9r and higher cut off side value: lr (i.e., a value of 1 up to 0.9l and then a linear roll off to zero at lr).
c) none;

Step 6: 1-d convolution with kernel of length 5:
{0.1364, 0.1364, 0.4545, 0.1364, 0.1364} for l=1;
{0.1538, 0.1538, 0.3846, 0.1538, 0.1538} for l=2;
{0.1667, 0.1667, 0.3333, 0.1667, 0.1667} for l=3;
{0.1765, 0.1765, 0.2941, 0.1765, 0.1765} for l=4;
{0.1842, 0.1842, 0.2632, 0.1842, 0.1842} for l=5;
{0.1905, 0.1905, 0.2381, 0.1905, 0.1905} for l=6;
{0.1957, 0.1957, 0.2174, 0.1957, 0.1957} for l=7;
{0.2000, 0.2000, 0.2000, 0.2000, 0.2000} for l=8;

Step 7: k=4 for equation (8);

Step 8: none.

MR images may be used to evaluate the performance of the proposed noise smoothing, structure preserving and high processing speed filter of this invention. For example, the images of FIGS. 7–10D were acquired with a commercially available low-field-strength (640G) permanent magnet imager (ACCESS™ Toshiba-America MRI Inc.). All images in the experiments have the same image signal data array structure $A\{(n_1, n_2): 1 \leq n_1 \leq 256, 1 \leq n_2 \leq 256\}$.

From equations (8) and (16), it is apparent that larger filter parameters k and j make the direction selection of the filters more sensitive to image structures, but larger values of k and j also require more computation. Also, there is a trade-off between edge preserving and noise smoothing when choosing the low-pass parameter k. As k increases, the edge preserving performance of the filter becomes better while the noise smoothing performance becomes weaker. In practice, a filter with a value of k≈4 provides good results for noise smoothing and edge preserving.

Figure 7:
FIG. 7 is a photograph showing an input sagittal head image produced by a conventional three-dimensional MRI system.
Figure 8A:
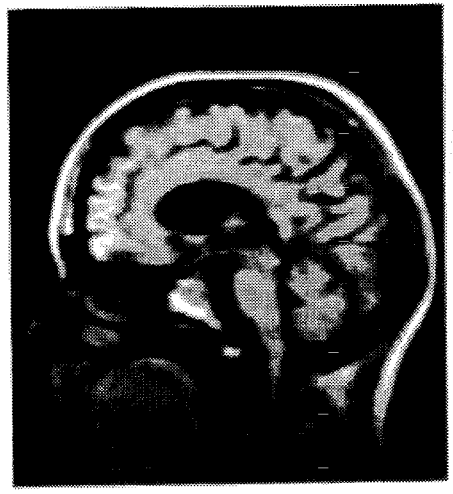
FIGS. 8A, 8B, 8C and 8D are photographs illustrating exemplary subimages which result from oriented low-pass LSI filtering of the FIG. 7 head image along the 0°, 90°, 45° and 135° directions, respectively.
Figure 8B:
Figure 8C:
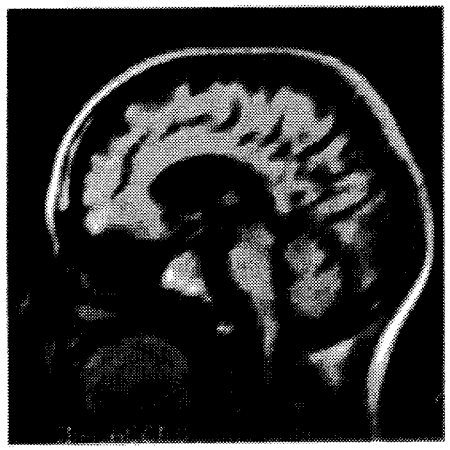
Figure 8D:
Figure 9:
FIG. 9 is a photograph depicting a noise-smoothed filtered image generated as a weighted combination of the subimages in FIGS. 8A–8D.
Figure 10A:
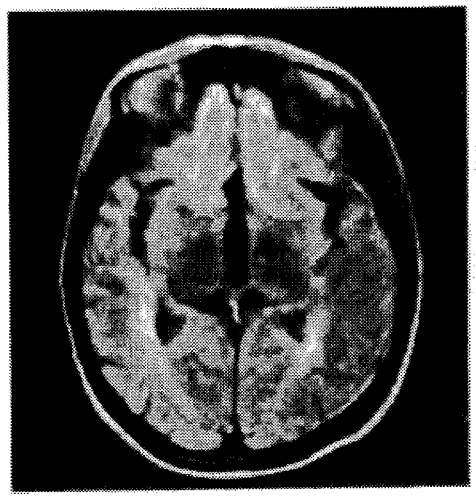
FIGS. 10A, 10B, 10C and 10D are photographs illustrating two pairs of original and filtered transaxial head images from a two-dimensional MRI using first spin echo MR image data (FIGS. 10A, 10B) and using second spin echo MR image data (FIGS. 10C, 10D).
Figure 10B:
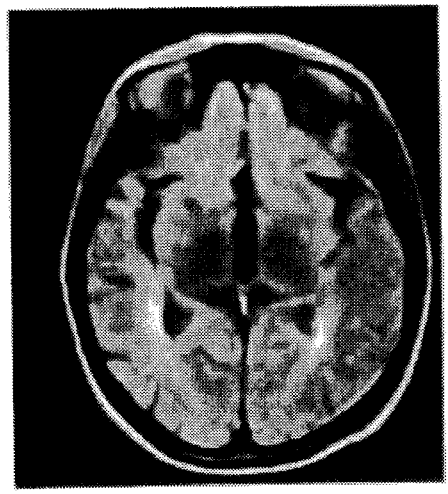
Figure 10C:
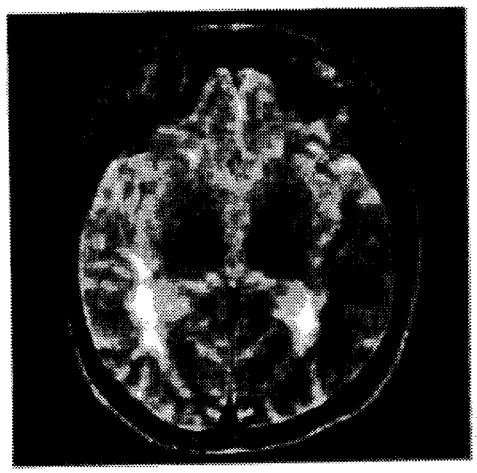
Figure 10D:
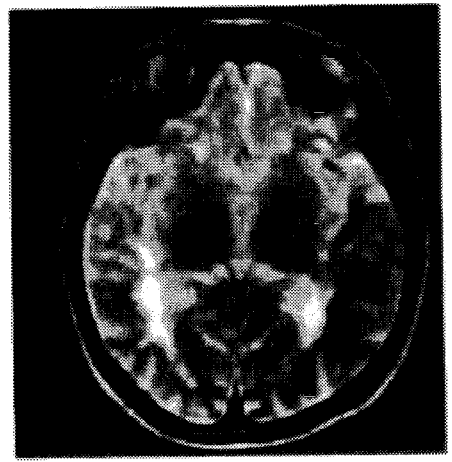

In the first experiment, a sagittal head image from a three-dimensional (3D) acquisition was used. The original image is shown in FIG. 7. Four oriented low-pass filters, as defined in equation (2) with $$\alpha_i = \frac{1}{5}$$

were used to obtain the four subimages shown in FIGS. 8A, 8B, 8C and 8D respectively. The power parameter k=4 was used for determination of the weighting parameters in equation (8). These subimages have strong oriented structures as a result of the oriented low-pass filtering. Edge and line structures along one direction are smoothed and preserved by the filter in the same direction but are blurred by the filters in other directions. The components of each subimage are chosen according to the image differences to contribute to the final low-pass filtered and edge enhanced image shown in FIG. 9. It is clear that noise in the image of FIG. 7 has been effectively reduced and that image structures have been well preserved in FIG. 9. Noise reduction can also be appreciated by comparing noise SD values before and after the filtering. The SD value was estimated on a non-textured image area with 200 pixels (e.g., see L. Kaufman, D. M. Kramer, L. E. Crooks and D. A. Ortendahl, "Measuring Signal-to-Noise Ratios in MR Imaging," Radiology 1989; 173:265–67). The SD value in FIG. 7 is 83 which is reduced to 42 in FIG. 9 by filtering. Two transaxial head images (one based on first-occurring NMR spin echo responses and one based on second-occurring NMR spin echo responses) from a two-dimensional (2D) acquisition were also used to better appreciate the filter's performance. These two images have lower SNRs than the previous 3D image, especially the second echo image. The original image and the filtered image for the first echo are shown in FIG. 10A and FIG. 10B. The original image and the filtered image for the second echo are shown in FIG. 10C and FIG. 10D, respectively. Again, 200 pixels were used for SD estimations. It can be seen that the filtered images have a much better visual quality than the original images.

Based on the described filter structure, an array processor (Warrior, SKY Computers, Inc.) was used to implement this algorithm in conjunction with a Micro VAX-II system (Digitial Equipment Corporation) by suitably programming a Toshiba ACCESS™ MRI system (which already includes such hardware components). A synchronous array of parallel processing elements (PE) in the array processor handles one instruction and multiple data to achieve high processing speed. As a result, a high throughput in image processing is achieved. The time used for processing an image of 256 by 256 pixels may be less than 5 seconds. Since four subimages need to be stored in this filter, compared with conventional adaptive filters using local operations or recursive approaches, a disadvantage of this filter is the requirement of providing more image storage. This filter is also suitable for implementation with multiprocessor systems. Unlike array processors, a multi-processor system includes multiple processors and these processors communicate and cooperate at different levels in solving a given problem (e.g., see K. Hwang, *Computer Architecture and Parallel Processing*, McGraw-Hill, Inc., 1984, the entire content of which is hereby incorporated by reference). From FIGS. 3 and 4, it can be seen that both the low-pass filtering part and the edge sharpening pan of this filter are highly parallel. Therefore, the computational task involved in four independent low-/ high-pass filtering channels can be partitioned and allocated to different processors. For example, if the multi-processor computer system by Mercury Computer System (e.g., see J. Goddard, J. Greene, B. S. Isenstein, F. P. Lauginiger and L. C. Walsh, "Multi-computer Implementations of Reconstruction and Postprocessing Algorithms," Proceedings of SMRM 11th Annual Meeting, Berlin, August 1992) is used, each processor in this four processor system can be assigned to compute $x_{li}$, $d_i$, $w_{li}$, and $\hat{x}_{li}$ in the low-pass stage and $x_{hi}$, $w_{hi}$, and $\hat{x}_{hi}$ in the high-pass stage to achieve parallel processing for fast image enhancement. The data communication between different channels is required only in calculating the weighting parameters $w'_{li}$s and $w'_{hi}$s therefore high speed processing can be expected.

A simple fast image filter has been presented. The filter effectively reduces image noise while preserving image structures. The filtering performance and computational efficiency makes it useful for fast medical image noise reduction and thus also helpful for many other image distortion corrections. The parallel structure of the filter can be utilized for achieving further processing speed by using multi-processor system configurations.

While only a few exemplary embodiments of this invention have been described in detail, those skilled in the art will recognize that many variations and modifications of these embodiments may be made while yet retaining novel features and advantages of the invention. Accordingly, all such variations and modifications are intended to be included within the scope of the appended claims.

What is claimed is:

1. A method for filtering input digital image signals representing the arrayed pixels of a digitized image, said method comprising the steps of:

low-pass filtering said input digital image signals along each of a plurality of directions within said image to produce a respectively corresponding plurality of digitized subimage signal sets; and generating a set of noise-smoothed digital image signals as a weighted combination of said plurality of subimage signal sets by combining subimage signal sets that have been modified by respective weighting factors.

2. A method as in claim 1 where said weighted combination of each subimage signal set is a function of the difference between that subimage and the input digital image signal set.

3. A method as in claim 2 wherein a weighted input to said noise-smoothed digital image by a subimage decreases as said difference increases.

4. A method as in claim 1 further comprising:

generating a plurality of further digitized subimage signal sets by high-pass filtering said noise-smoothed digital image signals along each of a respectively corresponding plurality of directions within said image; and generating a set of sharpened digital image signals as a weighted combination of said plurality of further subimage signal sets by combining further subimage signal sets that have been modified by respective weighting factors.

5. A method as in claim 2 wherein a weighted combination of the differences between the subimages and the input digital image set is used to produce a set of sharpened digital image signals.

6. A method as in claim 4 or 5 wherein said noise-smoothed digital image signals and a portion of said sharpened digital image signals are combined to produce a composite filtered output image signal set.

7. A method as in claim 1 or 4 wherein said low-pass filtering is performed by linear space invariant low-pass filtering.

8. A method as in claim 7 wherein said linear space invariant low-pass filtering is performed in each of said directions by generating for each pixel a weighted combination of a predetermined number of its nearest neighbors in a line parallel to that direction by combining said predetermined number of nearest neighbors, each weighted by a respective weighting factor.

9. A method as in claim 1 or 4 wherein said plurality of directions of low-pass filtering includes four directions oriented at substantially 45° angular invervals within said image.

10. A method as in claim 8 wherein said plurality of directions of low-pass filtering includes four directions oriented at substantially 45° angular invervals within said image.

11. A method as in claim 4 wherein said high-pass filtering is performed by nonsymmetric high-pass filtering.

12. A method as in claim 11 wherein said nonsymmetric high-pass filtering is performed in each of said directions for high-pass filtering by generating for each pixel a weighted combination of a predetermined number of its nearest neighbors in a line parallel to that direction.

13. A method as in claim 12 wherein said weighted combination is generated nonsymmetrically both with respect to spatial direction and with respect to polarity.

14. A method as in claim 12 or 13 wherein said plurality of directions of high-pass filtering includes four directions oriented at substantially 45° angular intervals within said image.

15. Apparatus for filtering input digital image signals representing the arrayed pixels of a digitized image, said apparatus comprising:

means for low-pass filtering said input digital image signals along each of a plurality of directions within said image to produce a respectively corresponding plurality of digitized subimage signal sets; and means for generating a set of noise-smoothed digital image signals as a weighted combination of said plurality of subimage signal sets by combining subimage signal sets that have been modified by respective weighting factors.

16. Apparatus as in claim 15 including means for causing said weighted combination of each subimage signal set to be a function of the difference between that subimage and the input digital image signal set.

17. Apparatus as in claim 16, including means for causing a weighted input to said noise-smoothed digital image by a subimage to decrease as said difference increases.

18. Apparatus as in claim 15 further comprising:

means for generating a plurality of further digitized subimage signal sets by high-pass filtering said noise-smoothed digital image signals along each of a respectively corresponding plurality of directions within said image; and means for generating a set of sharpened digital image signals as a weighted combination of said plurality of further subimage signal sets by combining further subimage signal sets that have been modified by respective weighting factors.

19. Apparatus as in claim 16 including means for causing a weighted combination of the differences between the subimages and the input digital image set to be used to produce a set of sharpened digital image signals.

20. Apparatus as in claim 18 or 19 including means for effecting said noise-smoothed digital image signals and a portion of said sharpened digital image signals to be combined to produce a composite filtered output image signal set.

21. Apparatus as in claim 15 or 18 including means for effecting said low-pass filtering by linear space invariant low-pass filtering.

22. Apparatus as in claim 21 including means for performing said linear space invariant low-pass filtering in each of said directions by generating for each pixel a weighted combination of a predetermined number of its nearest neighbors in a line parallel to that direction by combining said predetermined number of nearest neighbors, each weighted by a respective weighting factor.

23. Apparatus as in claim 15 or 18 including means for causing said plurality of directions of low-pass filtering to include four directions oriented at substantially 45° angular invervals within said image.

24. Apparatus as in claim 22 including means for causing said plurality of directions of low-pass filtering to include four directions oriented at substantially 45° angular invervals within said image.

25. Apparatus as in claim 18 including means for performing said high-pass filtering by nonsymmetric high-pass filtering.

26. Apparatus as in claim 25 including means for performing said nonsymmetric high-pass filtering in each of said directions by generating for each pixel a weighted combination of a predetermined number of its nearest neighbors in a line parallel to that direction.

27. Apparatus as in claim 26 including means for generating said weighted combination nonsymmetrically both with respect to spatial direction and with respect to polarity.

28. Apparatus as in claim 26 or 27 including means for causing said plurality of directions of high-pass filtering to include four directions oriented at substantially 45° angular intervals within said image.

29. An MRI system comprising an MR image data processor incorporating an array processor, said MR image data processor being programmed to effect the following signal processing for filtering input digital image signals representing the arrayed pixels of a digitized image:

low-pass filtering said input digital image signals along each of a plurality of directions within said image to produce a respectively corresponding plurality of digitized subimage signal sets; and generating a set of noise-smoothed digital image signals as a weighted combination of said plurality of subimage signal sets by combining subimage signal sets that have been modified by respective weighting factors.

30. An MRI system as in claim 29, wherein said MR image data processor being programmed to cause said weighted combination of each subimage signal set to be effected in dependence upon the difference between that subimage and the input digital imagine signal set.

31. An MRI system as in claim 30, said MR image data processor being programmed to cause the contribution to said noise-smoothed digital image by a subimage decreases as said difference increases.

32. An MRI system as in claim 29, said MR image data processor being programmed to generate a plurality of further digitized subimage signal sets by high-pass filtering said noise-smoothed digital image signals along each of a respectively corresponding plurality of directions within said image; and generate a set of sharpened digital image signals as a weighted combination of said plurality of further subimage signal sets by combining further subimage signal sets that have been modified by respective weighting factors.

33. An MRI system as in claim 30, said MR image data processor being programmed to cause a weighted combination of the differences between the subimages and the input digital image set to be used to produce a set of sharpened digital image signals.

34. An MRI system as in claim 32 or 33, said MR image data processor being programmed to cause said noise-smoothed digital image signals and a portion of said sharpened digital image signals to be combined to produce a composite filtered output image signal set.

35. An MRI system as in claim 29 or 32, said MR image data processor being programmed to effect said low-pass filtering by linear space invariant low-pass filtering.

36. An MRI system as in claim 35, said MR image data processor being programmed to effect said linear space invariant low-pass filtering in each of said directions by generating for each pixel a weighted combination of a predetermined number of its nearest neighbors in a line parallel to that direction.

37. An MRI system as in claim 29 or 32, said MR image processor being programmed to cause said plurality of directions of low-pass filtering to include four directions oriented at substantially 45° angular intervals within said image.

* * * * *